United States Patent [19]

Misawa et al.

[11] Patent Number: 4,901,134
[45] Date of Patent: Feb. 13, 1990

[54] SEMICONDUCTOR DEVICE AND MANUFACTURING METHOD THEREOF

[75] Inventors: Yutaka Misawa, Katsuta; Osamu Saito, Musashino, both of Japan

[73] Assignee: Hitachi, Ltd., Tokyo, Japan

[21] Appl. No.: 184,370

[22] Filed: Apr. 21, 1988

Related U.S. Application Data

[63] Continuation of Ser. No. 794,687, Nov. 4, 1985, abandoned.

[30] Foreign Application Priority Data

Nov. 2, 1984 [JP]  Japan .................................. 59-231489
Nov. 28, 1984 [JP] Japan .................................. 59-251376

[51] Int. Cl.⁴ ..................... H01L 23/48; H01L 29/04; H01L 23/48; H01L 29/78
[52] U.S. Cl. ......................................... 357/67; 357/59; 357/71; 357/23.9
[58] Field of Search ................. 357/59 G, 59 I, 59 K, 357/71 S, 23.9, 67 S; 437/192, 52

[56] References Cited

U.S. PATENT DOCUMENTS 4,453,175  6/1984  Ariizumi et al. .................... 357/23.9
4,558,507 12/1985  Okabayashi et al. ................ 357/59
4,622,735 11/1986  Shibata ............................... 357/71 S

FOREIGN PATENT DOCUMENTS 2082387  3/1982  United Kingdom .

OTHER PUBLICATIONS

Okabayashi et al., "Low-Resistance MOS Technology Using Self-Aligned Refractory Silicidation", IEEE Transactions on Electron Devices, ED-31, No. 9, Sep. 84, pp. 1329-1333.

Primary Examiner—Rolf Hille
Assistant Examiner—Robert P. Limanek
Attorney, Agent, or Firm—Antonelli, Terry & Wands

[57] ABSTRACT

A semiconductor LSI device formed in a semiconductor substrate comprising source/ drain regions of a MOSFET, polycrystalline silicon conductor to be connected to the source/drain region, and a silicide layer interposed between the source/drain region and the polycrystalline silicon conductor. Silicide intrudes into silicon bulk through an oxide film on the silicon substrate surface, assuring contact of low resistance, while lateral resistance of the source/drain region formed in the semiconductor substrate is also reduced. Reduction of contact/connection resistances is accomplished in a high density LSI which is thus imparted with an improved high-speed performance.

23 Claims, 5 Drawing Sheets

SEMICONDUCTOR DEVICE AND MANUFACTURING METHOD THEREOF

This application is a continuation of application Ser. No. 794,687, filed Nov. 4, 1985 now abandoned.

BACKGROUND OF THE INVENTION

The present invention generally relates to a semiconductor device and a method of manufacturing the same. In particular, the invention concerns a semiconductor device incorporating polycrystalline silicon interconnections and a manufacturing method thereof.

In recent years, there arises an increasing tendency of using polycrystalline silicon in the semiconductor integrated circuit device for meeting the demand for implementation of high-speed semiconductor devices with high integration density. In particular, in the case of a MOSLSI in which insulated gate field effect transistors (IGFETs) are employed, there is obtained an advantage that the gate electrode of the IGFET and the interconnection layer can b formed of a same polycrystalline silicon layer. Besides, by selectively doping a polycrystalline silicon layer at regions with impurity at a high concentration to exhibit a low resistivity in such a manner that a polycrystalline silicon region of high resistivity is sandwiched therebetween, it is possible to incorporate resistors in the polycrystalline silicon layer. In other words, importance of polycrystalline silicon becomes predominant in the implementation of semiconductor devices and in particular in silicon IC device and silicon LSI device.

Polycrystalline silicon is usually formed through chemical vapor deposition (referred to as CVD in abbreviation), according to which silicon wafers are introduced into a heated quartz tube and supplied with a raw material gas (such as monosilane or the like), to thereby deposit polycrystalline silicon on the wafers. However, this method is accompanied with a problem that oxygen contained in the air may enter the quartz tube together with the wafers upon introducing wafers into the quartz tube, resulting in that exposed regions (contact holes or windows) of the silicon wafer will become oxidized more or less. As a consequence, a thin oxide film is formed between the silicon surface within the contact windows and the polycrystalline silicon film deposited on the silicon surface, whereby contact resistance of the polycrystalline silicon layer is increased, degrading the performance of the semiconductor device. In an extreme case, electric breakage (open-circuiting) will take place between the silicon wafer and the polycrystalline silicon layer, as the result of which yield of the manufactured semiconductor devices is decreased. Increasing the high integration density of the semiconductor LSI requires corresponding reduction of area available for a unit element, being accompanied with reduction in the area of the contact region (window). Under the circumstances, when the polycrystalline silicon layer is to be used for the interconnection in the manner known heretofore, the problem involved in the formation of the polycrystalline silicon layer as described above becomes more serious, providing the cause for the significant increase of the contact resistance as well as degradation of reproducibility (yield) of the contacts.

SUMMARY OF THE INVENTION

An object of the present invention is to provide a semiconductor device incorporating polycrystalline silicon interconnection layers of low contact resistance.

Another object of the invention is to provide a semiconductor device having polycrystalline silicon interconnection layers and an impurity-doped region exhibiting low lateral resistance.

As described hereinbefore, a thin oxide film formed on a silicon substrate upon deposition of a polycrystalline silicon layer on the substrate provides a main cause for increasing the contact resistance. It is observed that when a silicide layer is interposed between the polycrystalline silicon layer and the substrate, the silicide layer grows to intrude into the substrate through the oxide film, assuring thus an improved contact of low resistance. Besides, the doped region formed within the substrate having the silicide layer formed on the surface exhibits reduced lateral resistance. Accordingly, when the contact area of interconnection conductors is decreased for realizing LSI having an increased integration density, increase in contact resistance due to the reduced contact area can be suppressed to minimum.

DESCRIPTION OF THE PREFERRED EMBODIMENTS

In the following, the invention will be described in detail in conjunction with the exemplary embodiments of the semiconductor device as well as the manufacturing method thereof by referring to the accompanying drawings.

Figure 1:
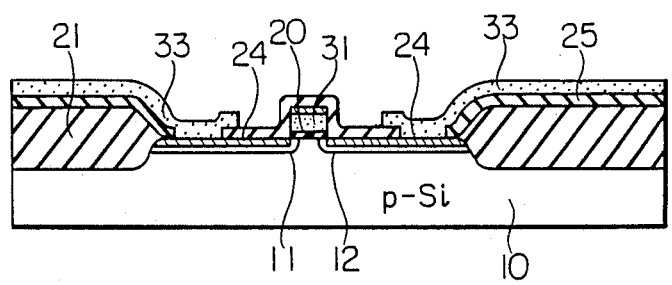
FIG. 1 is a sectional view showing a structure of a MOSFET according to an embodiment of the present invention.

FIG. 1 is a sectional view showing a portion of a semiconductor device according to an embodiment of the invention. As will be seen, a number of element regions (i.e. regions for the elements constituting parts of the semiconductor device) are formed on a major surface of a p-type monocrystalline silicon substrate 10. Additionally, a silicon oxide film (field oxide) 21 of a relatively great thickness is formed on the surface of the p-type monocrystalline silicon substrate 10 except for the element regions, among which only one element region is shown in the drawing. The silicon oxide film 21 serves for isolation among the elements and is referred to as LOCOS (local oxidation of silicon) oxide film. Formed at the center of the surface portion of the p-type monocrystalline silicon substrate 10 enclosed by the LOCOS oxide film 21 is a gate oxide film 20 on which a polycrystalline silicon layer 31 is formed to serve as a gate electrode. Formed on the surface portions of the p-type monocrystalline silicon substrate 10 located on both sides of the gate electrode 31 are a source region 11 and a drain region 12, respectively, through doping of n-type impurity. Each of the source region 11 and the drain region 12 has a molybdenum (Mo) silicide layer 24 formed over the substantially whole region. Except for portions (contact holes) of the Mo silicide layers 24, a CVD oxide film 25 is formed over the substrate (inclusive of the surfaces of the polycrystalline silicon layer 31 and the silicon oxide film 21). Finally, formed thereon are polycrystalline silicon layers 33 which serve as interconnection layers brought into contact with the Mo silicide layers 24 through the contact holes.

With the structure of the semiconductor device in which the molybdenum (Mo) silicide layer 24 is interposed between the silicon substrate 10 and the polycrystalline silicon layer 33 serving for the interconnection, as described above, contact of low resistance can be realized with an improved reproducibility. Further, because the diffused layer or doped region of the MOSFET is deposited thereon with the Mo silicide layer 24 over the whole surface thereof, lateral resistance of the diffused layer can be reduced, resulting in that the transconductance $g_m$ can be improved, to another advantage. It should be added that the deposition of the Mo silicide layer 24 over the gate electrode 31 allows resistance involved in the gate interconnection to be reduced, whereby contact to the polycrystalline silicon layer 31 serving as the gate electrode can be realized with low resistance.

A method of manufacturing the semiconductor device described above will be elucidated by referring to FIGS. 2A to 2H.

Figure 2A:
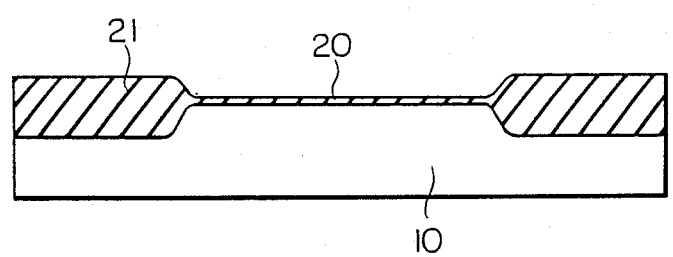
FIGS. 2A to 2H are sectional views for illustrating various steps for manufacturing the structure shown in FIG. 1.
Figure 2B:
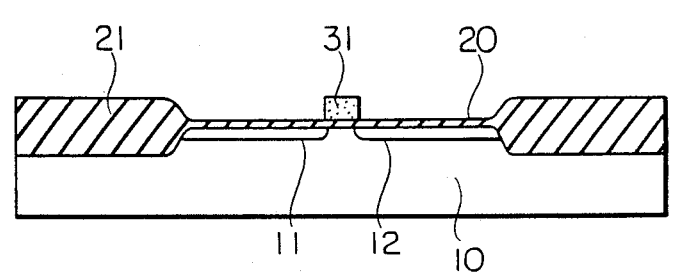
Figure 2C:
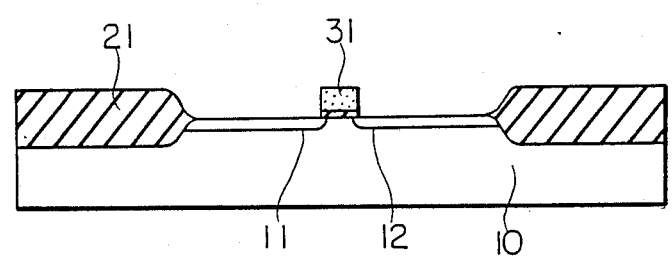
Figure 2D:
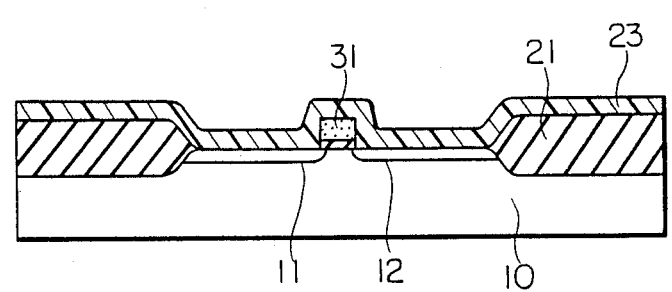
Figure 2E:
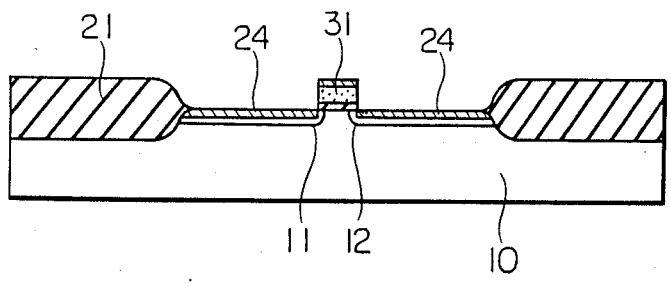
Figure 2F:
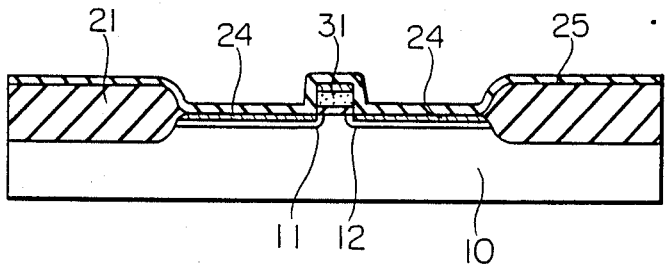
Figure 2G:
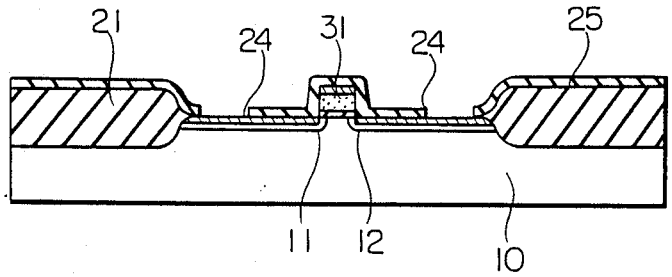
Figure 2H:
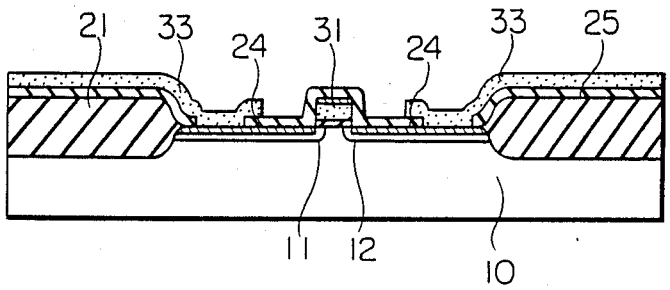

Referring to FIG. 2A, one major surface of the p-type monocrystalline silicon substrate 10 is first formed with a silicon oxide (SiO$_2$) thick film 21 serving for isolation of the elements through a selective oxidization (LOCOS) process, being followed by growth of a thin SiO$_2$ film 20 constituting the gate oxide film. Subsequently after the polycrystalline silicon film has been deposited over the whole surface through CVD process, phosphorus (P) is thermally diffused into polycrystalline silicon for imparting electric conductivity. Next, the polycrystalline silicon film is patterned through photo-etching technique to thereby form the gate electrode 31 of desired dimensions, as is shown in FIG. 2B. Subsequently, the regions which are to serve as the source and drain regions are implanted with arsenic (As) through ion beam irradiation process by employing the gate electrode 31 as the mask, to thereby form the self-aligned source and drain regions 11 and 12. Next, the thin gate oxide film is partially removed through etching process known in the art to thereby expose the source region 11 and the drain region 12, as shown in FIG. 2C. Subsequently, a molybdenum (Mo) film 23 is deposited over the whole surface of the substrate in a thickness of 500 Å through vacuum sputtering technique, as is shown in FIG. 2D. Then, the substrate undergoes heat treatment at 1000° C. for 30 minutes, thereby alloying the surfaces of silicon contacting directly the molybdenum film 23 (i.e. those of the source region 11, drain region 12 and the gate electrode 31), as the result of which the Mo silicide layers 24 are selectively formed. These M silicide layers are formed only on the silicon surfaces. The oxide film 21 undergoes no reaction with molybdenum. Accordingly, the molybdenum film on the oxide layer remains as it is. Subsequently, the molybdenum film 23 remaining on the oxide film 21 is etched away by using aqua regia, which results in the structure shown in FIG. 2E. It will be seen that Mo silicide films are left on the source region 11, the drain region 12 and the gate electrode 31. The silicon oxide film 25 is deposited over the whole surface of the structure through CVD process (FIG. 2F). The contact holes or windows for the source region 11 and the drain region 12 are formed in the silicon oxide film 25 through photoetching technique (FIG. 2G). Subsequently, the polycrystalline silicon film 33 is deposited over the whole surface of the substrate through CVD process. The whole surface of the polycrystalline silicon film 33 is implanted with arsenic (As) through ion beam implantation, being followed by heat treatment at 1000° C. for ten minutes for imparting the electric conductivity. Referring to FIG. 2H, polycrystalline silicon is removed through photo-etching technique except for the polycrystalline silicon regions 33 serving for interconnection to the source region 11 and to the drain region 12. In this manner, the structure shown in FIG. 1 can be implemented.

Figure 3A:
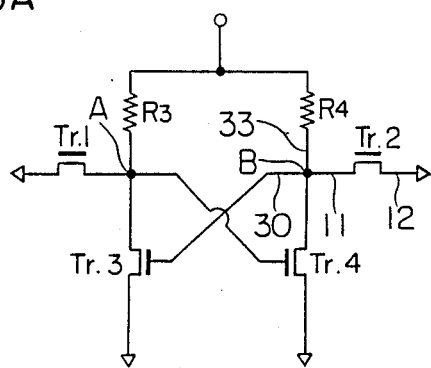
FIGS. 3A and 3B show a portion of a MOSFET according to another embodiment of the invention in an equivalent circuit diagram and a sectional view, respectively.

Next, description will be made on a MOS memory cell according to another embodiment of the present invention. FIG. 3A is an equivalent circuit diagram of one memory cell and FIG. 3B is a sectional view showing a portion of the structure for realizing the circuit configuration shown in FIG. 3A.

Referring to FIG. 3A, a pair of cross-wired MOSFETs Tr3 and Tr4 have respective load resistors R3 and R4 connected thereto. Junctions or interconnections A and B between the MOSFET Tr3 and the load resistor R3 and between the MOSFET Tr4 and the load resistor R4, respectively, are further connected to transfer gates Tr1 and Tr2, respectively, and additionally to the gates of the MOSFETs Tr4 and Tr3, respectively, of the counterpart branches, respectively. In this way, one cell of the static memory is implemented.

Figure 3B:
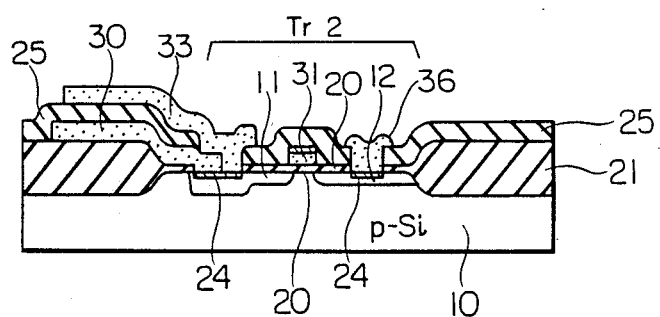

FIG. 3B is a partial sectional view of the structure of a semiconductor device adapted for realizing the circuit shown in FIG. 3A and shows more specifically interconnection of the source/drain region 11 (junction B) of the MOSFET Tr2. The n+-type source/drain regions 11 and 12 are formed in a p-type silicon substrate 10 through ion implantation, diffusion or the like. The MOSFET Tr2 is circumferentially surrounded by a relatively thick field oxide film 21. Molybdenum silicide layers 24 are formed at the contact hole portions of the source and drain regions 11 and 12, respectively. Connected to the molybdenum silicide layer 24 of the source/drain region 11 are polycrystalline silicon layers 30 and 33 which are isolated from each other by a CVD oxide layer 25. On the other hand, a polycrystalline silicon interconnection layer 36 is connected to the Mo silicide layer 24 of the source/drain region 12 at the same level as the polycrystalline silicon layer 33. Further, a Mo silicide layer is formed over the upper surface of the polycrystalline silicon layer 31 which serves as the gate electrode of the MOSFET Tr2. The structure shown in FIG. 3B differs from the one shown in FIG. 1 in that two polycrystalline silicon interconnection layers 30 and 33 are connected to the source/drain region 11 and that the molybdenum silicide layer is deposited only at the contact hole.

By virtue of the connection of the polycrystalline silicon layers 30 and 33 to the Mo silicide layer 24 which in turn is connected to the source/drain region 11 with low contact resistance, not only the contact resistance between the source/drain region 11 and the polycrystalline silicon layers 30 and 33 but also the connection resistance between the polycrystalline silicon layers 30 and 33 can be advantageously reduced. It will be self-explanatory that the interconnection layer 36 overlying the source/drain region 12 can be made of a metal instead of polycrystalline silicon.

Figure 4A:
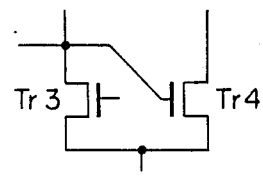
FIGS. 4A and 4B show a portion of a MOSFET according to still another embodiment of the invention in an equivalent circuit diagram and a sectional view.
Figure 4B:
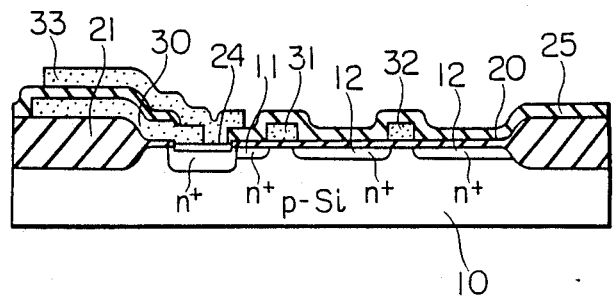

FIGS. 4A and 4B illustrate a structure in which two polycrystalline silicon interconnection layers are connected to one end of a serial connection of two MOSFETs Tr3 and Tr4. It should be noted that this structure may be realized as a part of the circuit shown in FIG. 3A.

Referring to the figures, $n^+$-type source/drain regions 11 and 12 are formed in a p-type silicon substrate 10 in a major surface thereof. The $n^+$-type source/drain region 11 located to the leftmost includes a deep portion for connection and a shallow portion defining the source/drain of the MOSFET (the same applies also to the structure shown in FIG. 3B).

According to the embodiment now under consideration, contact resistance between the silicon substrate and the polycrystalline silicon layers 30 and 33 can be reduced because of interposition of the molybdenum silicide layer 24 between the former and the latter. Besides, since the silicide layer 24 is so formed as to interconnect the polycrystalline silicon layers 30 and 33, connection resistance between these layers 30 and 33 can also be reduced, whereby characteristics of the implemented circuit can be improved. Further, the reproducibility of contact between the silicon substrate and the polycrystalline silicon layers can be enhanced. Additionally, since the source/drain region 11 of the MOSFET is partially deposited with the silicide layer 24, lateral resistance of the region 11 can also be reduced. Thus, the transconductance $g_m$ of the MOSFET can also be improved.

The structure shown in FIGS. 3A and 3B shares common features with the one shown in FIGS. 4A and 4B except for some differences. A method of manufacturing the structure shown in FIG. 4B will now be described by referring to FIGS. 5A to 5K. Modification of this method for realizing the structure shown in FIG. 3B will readily occur to those skilled in the art on the basis of the following description.

Figure 5A:
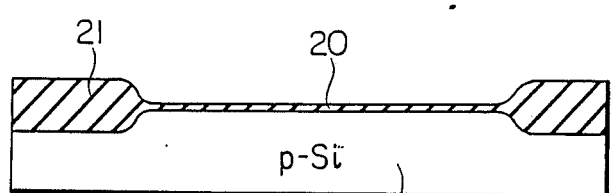
FIGS. 5A to 5K are sectional views for illustrating various steps for manufacturing the structure shown in FIG. 4B.
Figure 5B:
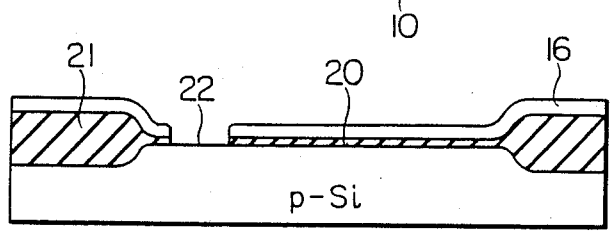
Figure 5C:
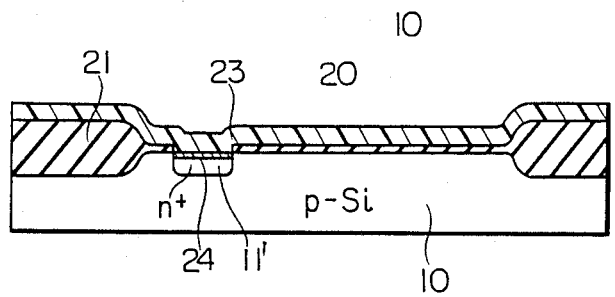
Figure 5D:
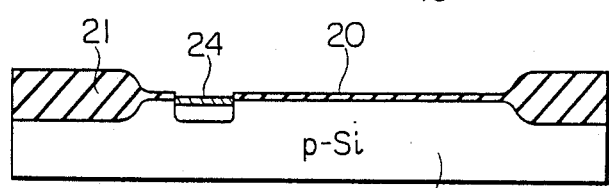
Figure 5E:
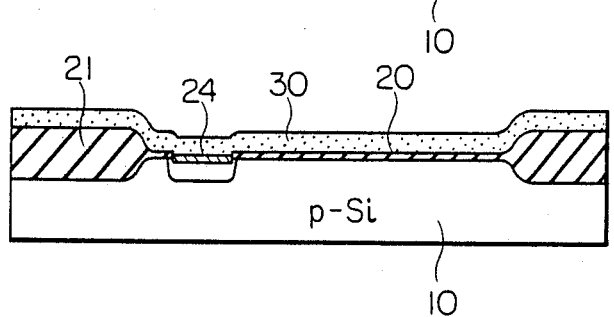
Figure 5F:
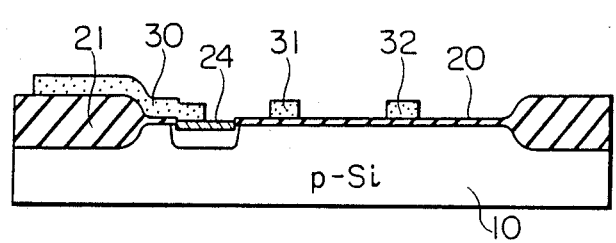
Figure 5G:
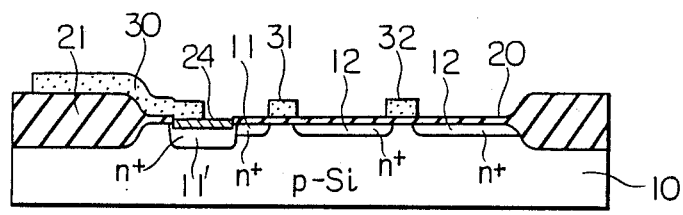
Figure 5H:
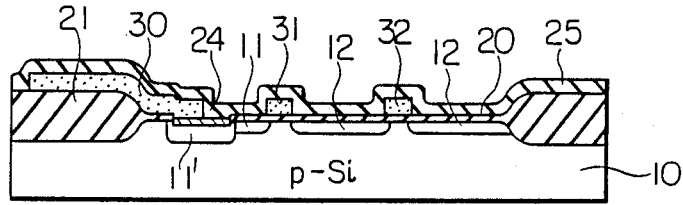
Figure 5I:
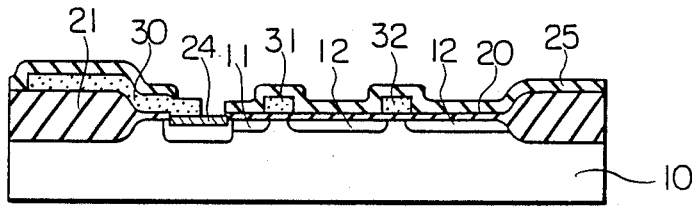
Figure 5J:
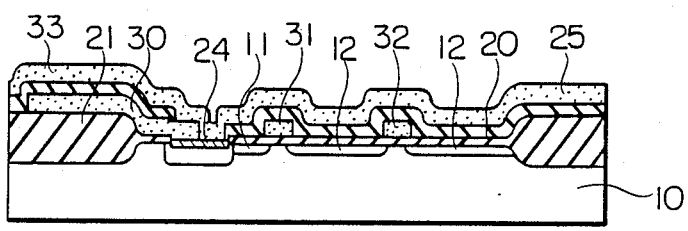
Figure 5K:
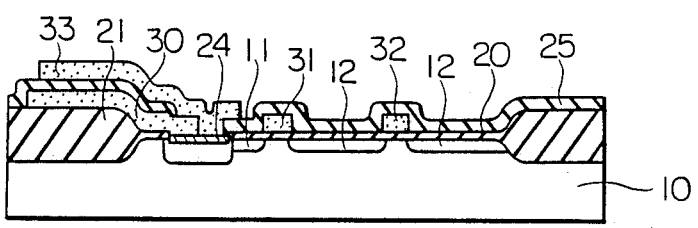

Referring to FIG. 5A, a thick oxide ($SiO_2$) film 21 serving for isolation among the elements is first formed on a major surface of a p-type monocrystalline silicon substrate 10 through selective oxidization (LOCOS) process, being followed by formation of a thin $SiO_2$-film 20. A photoresist layer 16 is spun on the oxide film and a contact window 22 is formed through photolithography technique (FIG. 5B). The contact hole or window 22 is formed by removing a part of the oxide film 20 for forming a region to be doped to $n^+$-type conductivity (FIG. 5B). A $n^+$-type region 11' is formed through ion implantation of n-type impurity such as phosphorus (P) by using the photoresist layer as a mask or alternatively through diffusion by using the oxide film 20 as the mask. In the latter case, the oxide film is once removed, being followed by growth of a new oxide film 20 which is then formed with a window by using the same mask. Next, a molybdenum (Mo) film 23 of 500 ° Å in thickness is deposited over the whole surface through vacuum sputtering method (FIG. 5C). The sub-structure thus obtained is subjected to heat treatment at 1000° C. for 30 minutes to thereby cause silicon (at the surface of the window region 22) which is in direct contact with the molybdenum film 23 to react with molybdenum, to thereby form a molybdenum (Mo) silicide layer 24 selectively only at the window region 22. It is noted that molybdenum undergoes no reaction with the $SiO_2$ films 20 and 21. Subsequently, molybdenum undergone no reaction is etched away by using aqua regia to leave the molybdenum (Mo) silicide layer on the contact hole region 22 (FIG. 5D). Next, a polycrystalline silicon film 30 is deposited through CVD, which film 30 is then made electrically conductive through thermal diffusion of phosphorus (P) in the polycrystalline silicon film 30. A photoresist layer is then applied on the polycrystalline silicon film 30 for patterning the latter through photolithography and dry etching, to thereby form the gate electrodes 31 and 32 and interconnection 30 of desired dimensions (FIG. 5F). It should be noted that the gate electrode 31 is in the state electrically continuous to the interconnection layer 30. Subsequently, the whole surface is irradiated with an ion beam of arsenic (As) to thereby form $n^+$-type source/drain regions 11 and 12, as shown in FIG. 5G. Next, a CVD oxide ($SiO_2$) film 25 is deposited over the whole surface, as shown in FIG. 5H. Subsequently, the oxide film 25 is selectively etched away through photolithography, as is shown in FIG. 5I. Then, a polycrystalline silicon film 33 is deposited through CVD, as shown in FIG. 5J, being followed by ion implantation of arsenic (As) and heat treatment. The polycrystalline silicon film 33 is then selectively etched away through photolithography and dry etching, while the portion of the film 33 overlying the polycrystalline silicon film 30 and the portion destined for interconnection to the layer 24 are left as they are (FIG. 5K). In this manner, the structure shown in FIG. 4B can be implemented.

It should be mentioned here that the molybdenum silicide layer serves as stopper for the dry etching, whereby the overetching of the silicon substrate at the region of the contact window can be effectively suppressed. Thus, nonuniformity in the characteristics of circuit elements due to the over-etched silicon substrate can be reduced, to an advantage.

Figure 6:
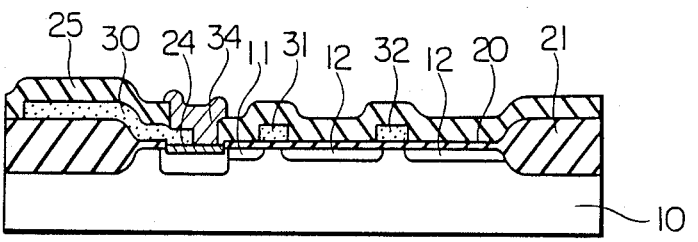
FIG. 6 is a partial sectional view of a MOSFET device according to a further embodiment of the invention.

FIG. 6 shows a modification of the structure shown in FIG. 4B in which the polycrystalline silicon layer 33 is replaced by a metal layer 34. With the structure shown in FIG. 6, metal electrodes exhibiting contact resistance reduced more significantly can be realized.

In the foregoing, the invention has been described in conjunction with exemplary embodiments thereof. It will however be appreciated that numerous modifications may be made without departing from the spirit and scope of the invention. As the metal for forming silicide, there may be used other metals exhibiting a high melting point such as, for example, tungsten (W), titanium (Ti) and tantalum (Ta) in addition to molybdenum (Mo). With regards to the manufacturing process, the species of ions for use in ion implantation, the conditions of heat treatment and the order or sequence of processing steps may be changed. Further, the polycrystalline silicon film serving as the gate may be replaced by a duplex structure consisting of a metal silicide and polycrystalline silicon. The polycrystalline silicon electrode and a portion of interconnections may be replaced by aluminium silicide electrode and interconnection to similar effect. In the case of the embodiments described hereinbefore, deposition of the molybdenum film is realized by the vacuum sputtering. However, one selected from Mo, W, Ti, Ta and others may be deposited through CVD in the form of film on the silicon substrate at regions where no SiO$_2$ film is formed. Further, a same metal layer as the one forming the overlying silicide layer may be formed over the latter to similar effect.

We claim:

1. A semiconductor device comprising:
a semiconductor substrate having a region doped with impurity of an conductivity type differing from that of said semiconductor substrate, the impurity-doped region including a relatively deep portion intruding into the semiconductor substrate and a relatively shallow portion;
an insulation layer having a window through which at least part of said relatively deep portion of said impurity-doped region is exposed;
a silicide layer formed on said relatively deep portion of said impurity-doped region, the relatively deep portion and the silicide layer being substantially aligned with said window; and
at least two electrodes each directly contacting said silicide layer, one of said electrodes being mainly formed of a same main component material as said semiconductor substrate.

2. A semiconductor device according to claim 1, wherein said semiconductor device includes an insulated gate field effect transistor (IGFET), said impurity-doped region constituting one of source/drain regions of said IGFET.

3. A semiconductor device according to claim 1, wherein said semiconductor device includes at least two IGFETs, and said one electrode is connected to a source/drain region of one of said IGFETs and serves as a gate electrode of the other IGFET.

4. A semiconductor device according to claim 1, wherein said semiconductor substrate is silicon, and said one of said at least two electrodes is formed of polycrystalline silicon.

5. A semiconductor device according to claim 1, wherein said silicide layer extends over substantially the whole surface of said impurity-doped region.

6. A semiconductor device according to claim 4, wherein said polycrystalline electrodes extend over only part of said silicide layer.

7. A semiconductor device according to claim 1, wherein said window exposes only a portion of said impurity-doped region.

8. A semiconductor device according to claim 1, wherein at least one of said at least two electrodes is formed of metal, and at least one of said at least two electrodes is formed of polycrystalline silicon.

9. A semiconductor device according to claim 1, wherein said silicide is selected from the group consisting of molybdenum, tungsten, titanium and tantalum.

10. A semiconductor device according to claim 7, wherein said silicide layer extends only in the area substantially equal to the area exposed in said window.

11. A semiconductor device comprising:
a semiconductor substrate having a region doped with impurity of a conductivity type differing from that of said semiconductor substrate, the impurity-doped region including a relatively deep portion intruding into the semiconductor substrate and a relatively shallow portion;
an insulation layer having a window through which at least part of said relatively deep portion of said impurity-doped region is exposed;
a silicide layer formed on said relatively deep portion of said impurity-doped region, said relatively deep portion and said silicide layer having substantially a same shape, in plan view, as said window; and
at least two electrodes each directly contacting said silicide layer, one of said electrodes being mainly formed of a same main component material as said semiconductor substrate, said electrodes having a low connection resistance in the interconnection therebetween and a low contact resistance in the contact between each of the electrodes and the impurity-doped region, as compared to the connection and contact resistances without a silicide layer between the at least two electrodes and the impurity-doped region.

12. A semiconductor device according to claim 11, wherein said semiconductor device includes an insulated gate field effect transistor (IGFET), said impurity-doped region constituting one of source/drain regions of said IGFET.

13. A semiconductor device according to claim 11, wherein said semiconductor device includes at least two IGFETs, and said one electrode is connected to a source/drain region of one of said IGFETs and serves as a gate electrode of the other IGFET.

14. A semiconductor device according to claim 11, wherein said semiconductor substrate is silicon and said one of at least two electrodes is formed of polycrystalline silicon.

15. A semiconductor device according to claim 11, wherein said silicide layer extends over substantially the whole surface of said impurity-doped region.

16. A semiconductor device according to claim 14, wherein said polycrystalline electrodes extends over only part of said silicide layer.

17. A semiconductor device according to claim 11, wherein said window exposes only a portion of said impurity-doped region.

18. A semiconductor device according to claim 11, wherein at least one of said at least two electrodes is formed of metal, and at least one of said at least two electrodes is formed of polycrystalline silicon.

19. A semiconductor device according to claim 11, wherein said silicide is selected from the group consisting of molybdenum, tungsten, titanium and tantalum.

20. A semiconductor device according to claim 17, wherein said silicide layer extends only in the area substantially equal to the area exposed in said window.

21. A semiconductor device according to claim 1, wherein each of the at least two electrodes directly contact the silicide only over the relatively deep portion of the impurity-doped region.

22. A semiconductor device according to claim 1, wherein the semiconductor device is a field effect transistor, the relatively shallow portion being a source or drain region of the field effect transistor, and the relatively deep portion being a portion for connection of the at least two electrodes to the source or drain region.

23. A semiconductor device according to claim 1, wherein the relatively deep portion is a portion for connection of the at least two electrodes to the impurity-doped region.

* * * * *